United States Patent
Chen et al.

(10) Patent No.: US 10,348,194 B1
(45) Date of Patent: Jul. 9, 2019

(54) PUMP CIRCUIT IN A DRAM, AND METHOD FOR CONTROLLING AN OVERALL PUMP CURRENT

(71) Applicant: NANYA TECHNOLOGY CORPORATION, New Taipei (TW)

(72) Inventors: Chih-Jen Chen, Taoyuan (TW); Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/012,552

(22) Filed: Jun. 19, 2018

(51) Int. Cl.
*G11C 5/14* (2006.01)
*H02M 3/07* (2006.01)
*G11C 11/4074* (2006.01)

(52) U.S. Cl.
CPC .............. *H02M 3/07* (2013.01); *G11C 5/145* (2013.01); *G11C 5/147* (2013.01); *G11C 11/4074* (2013.01)

(58) Field of Classification Search
CPC .......................... G11C 5/14; G11C 5/141–148
USPC ........................................ 365/226, 227, 228
See application file for complete search history.

(56) References Cited

U.S. PATENT DOCUMENTS

| | | | |
|---|---|---|---|
| 2012/0056666 A1* | 3/2012 | Ryu | G01R 31/2884 327/538 |
| 2015/0194878 A1* | 7/2015 | Hu | H02M 3/07 365/226 |

* cited by examiner

*Primary Examiner* — Han Yang
(74) *Attorney, Agent, or Firm* — Muncy, Geissler, Olds & Lowe, P.C.

(57) ABSTRACT

The present disclosure provides a pump circuit comprising a plurality of first enabling modules. Each of the plurality of first enabling modules is configured to generate a first enable signal and includes a first voltage input, a first comparing unit, a first digital logic gate and a second digital logic gate. The first comparing unit is coupled to the first voltage input and is configured to compare a voltage of the first voltage input with a first reference voltage. The first digital logic gate is coupled to the first comparing unit and is configured to implement a logical operation. The second digital logic gate is coupled to the first digital logic gate and is configured to implement a logical negation. Each of the plurality of first enabling modules generates the first enable signal when the voltage of the first voltage input is less than the first reference voltage.

20 Claims, 17 Drawing Sheets

| Input signal 1 | Input signal 2 | Output signal |
|---|---|---|
| 0 | 0 | 1 |
| 0 | 1 | 0 |
| 1 | 0 | 0 |
| 1 | 1 | 0 |

FIG. 13

| Input signal | Output signal |
|---|---|
| 0 | 1 |
| 1 | 0 |

FIG. 14

PUMP CIRCUIT IN A DRAM, AND METHOD FOR CONTROLLING AN OVERALL PUMP CURRENT

TECHNICAL FIELD

The present disclosure relates to a circuit, a dynamic random access memory (DRAM), and a method for controlling a current, and more particularly, to a pump circuit, a DRAM, and a method for controlling an overall pump current.

DISCUSSION OF THE BACKGROUND

When a conventional dynamic random access memory (DRAM) undergoes a reliability-testing process, an excessive power supply voltage (VDD) may cause metal electron migration, thereby causing electrical overstress (EOS) damage to the conventional DRAM.

The conventional DRAM includes a plurality of word lines and a pump circuit. The plurality of word lines are actuated by a pump current. The pump circuit includes a pumping module configured to generate the pump current for the plurality of word lines when a word line voltage (Vccp) is less than a reference voltage. Since an amplitude of the pump current cannot be adjusted, when the VDD is excessive, the EOS damage may occur.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a pump circuit. The pump circuit comprises a plurality of pumping modules and a plurality of first enabling modules. Each of the plurality of pumping modules is configured to generate a pump current. The plurality of first enabling modules are respectively coupled to a portion of the plurality of pumping modules. Each of the plurality of first enabling modules is configured to generate a first enable signal. In some embodiments, each of the plurality of first enabling modules includes a first voltage input, a first comparing unit, a first digital logic gate and a second digital logic gate. The first comparing unit is coupled to the first voltage input and is configured to compare a voltage of the first voltage input with a first reference voltage. The first digital logic gate is coupled to the first comparing unit and is configured to implement a logical operation. The second digital logic gate is coupled to the first digital logic gate and is configured to implement a logical negation. In some embodiments, each of the plurality of first enabling modules generates the first enable signal when the voltage of the first voltage input is less than the first reference voltage.

In some embodiments, the pump circuit further comprises a first voltage-dividing module coupled to the plurality of first enabling modules and configured to convert a power supply voltage to the voltage of the first voltage input for each of the plurality of first enabling modules.

In some embodiments, the first voltage-dividing module includes a plurality of first dividing resistors. In some embodiments, the first voltage input of each of the plurality of first enabling modules is coupled to a node that is between a corresponding pair of the plurality of first dividing resistors.

In some embodiments, the pump circuit further comprises a plurality of second enabling modules respectively coupled to the remaining of the plurality of pumping modules. In some embodiments, each of the plurality of second enabling modules is configured to generate a second enable signal, and includes a second voltage input and a second comparing unit. In some embodiments, the second comparing unit is coupled to the second voltage input and is configured to compare a voltage of the second voltage input with a second reference voltage. In some embodiments, each of the plurality of second enabling modules generates the second enable signal when the voltage of the second voltage input is less than the second reference voltage.

In some embodiments, the pump circuit further comprises a second voltage-dividing module coupled to the plurality of second enabling modules, wherein the second voltage-dividing module is configured to convert a word line voltage to the voltage of the second voltage input for each of the plurality of second enabling modules.

In some embodiments, the second voltage-dividing module includes a plurality of second dividing resistors. In some embodiments, the second voltage input of each of the plurality of second enabling modules is coupled to a node that is between a corresponding pair of the plurality of second dividing resistors.

Another aspect of the present disclosure provides a dynamic random access memory (DRAM). The DRAM comprises a memory array, a plurality of word lines and a charge pump system. The plurality of word lines are disposed in the memory array. The charge pump system is coupled to the plurality of word lines and is configured to generate an overall pump current for the plurality of word lines. In some embodiments, the charge pump system includes a pump circuit including a plurality of pumping modules and a plurality of first enabling modules. Each of the plurality of pumping modules is configured to generate a pump current. The plurality of first enabling modules are respectively coupled to a portion of the plurality of pumping modules. Each of the plurality of first enabling modules is configured to generate a first enable signal. In some embodiments, each of the plurality of first enabling modules includes a first voltage input, a first comparing unit, a first digital logic gate and a second digital logic gate. The first comparing unit is coupled to the first voltage input and is configured to compare a voltage of the first voltage input with a first reference voltage. The first digital logic gate is coupled to the first comparing unit and is configured to implement a logical operation. The second digital logic gate is coupled to the first digital logic gate and is configured to implement a logical negation. In some embodiments, each of the plurality of first enabling modules generates the first enable signal when the voltage of the first voltage input is less than the first reference voltage.

In some embodiments, the pump circuit further includes a first voltage-dividing module coupled to the plurality of first enabling modules and configured to convert a power supply voltage to the voltage of the first voltage input for each of the plurality of first enabling modules.

In some embodiments, the first voltage-dividing module includes a plurality of first dividing resistors. In some embodiments, the first voltage input of each of the plurality of first enabling modules is coupled to a node that is between a corresponding pair of the plurality of first dividing resistors.

In some embodiments, the pump circuit further includes a plurality of second enabling modules respectively coupled to the remaining of the plurality of pumping modules. In some embodiments, each of the plurality of second enabling modules is configured to generate a second enable signal, and includes a second voltage input and a second comparing unit. In some embodiments, the second comparing unit is coupled to the second voltage input and is configured to compare a voltage of the second voltage input with a second reference voltage. In some embodiments, each of the plurality of second enabling modules generates the second enable signal when the voltage of the second voltage input is less than the second reference voltage.

In some embodiments, the pump circuit further includes a second voltage-dividing module coupled to the plurality of second enabling modules, wherein the second voltage-dividing module is configured to convert a word line voltage to the voltage of the second voltage input for each of the plurality of second enabling modules.

In some embodiments, the second voltage-dividing module includes a plurality of second dividing resistors. In some embodiments, the second voltage input of each of the plurality of second enabling modules is coupled to a node that is between a corresponding pair of the plurality of second dividing resistors.

In some embodiments, the charge pump system further includes an oscillator coupled to the pump circuit and configured to generate a clock signal for the pump circuit.

In some embodiments, the pump circuit generates the overall pump current based on an oscillating frequency of the oscillator.

In some embodiments, the oscillating frequency of the oscillator is fixed.

In some embodiments, the oscillating frequency of the oscillator is variable.

Another aspect of the present disclosure provides a method for controlling an overall pump current. The method comprises the following steps. A voltage of a voltage input is compared with a reference voltage. An inverted signal is generated. A logical operation is implemented based on a comparison between the voltage of the voltage input, the reference voltage and the inverted signal. A first enable signal is generated based on a result of the logical operation.

In some embodiments, the method further comprises a step, in which a power supply voltage is converted to the voltage of the voltage input.

In some embodiments, the first enable signal is generated when the voltage of the voltage input is less than the reference voltage.

In some embodiments, the inverted signal is generated from a second enable signal.

With the above-mentioned configurations of the pump circuit, an overall pump current generated by the pump circuit for the plurality of word lines can be controlled. As a result, electrical overstress (EOS) damage to the DRAM can be prevented. Consequently, the disadvantages of a conventional pump circuit can be alleviated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIG. 13 is a truth table of a logical operation of a first digital logic gate of the second enabling module in accordance with some embodiments of the present disclosure.

FIG. 14 is a truth table of a logical negation of a second digital logic gate of the second enabling module in accordance with some embodiments of the present disclosure.

DETAILED DESCRIPTION

Figure 1:
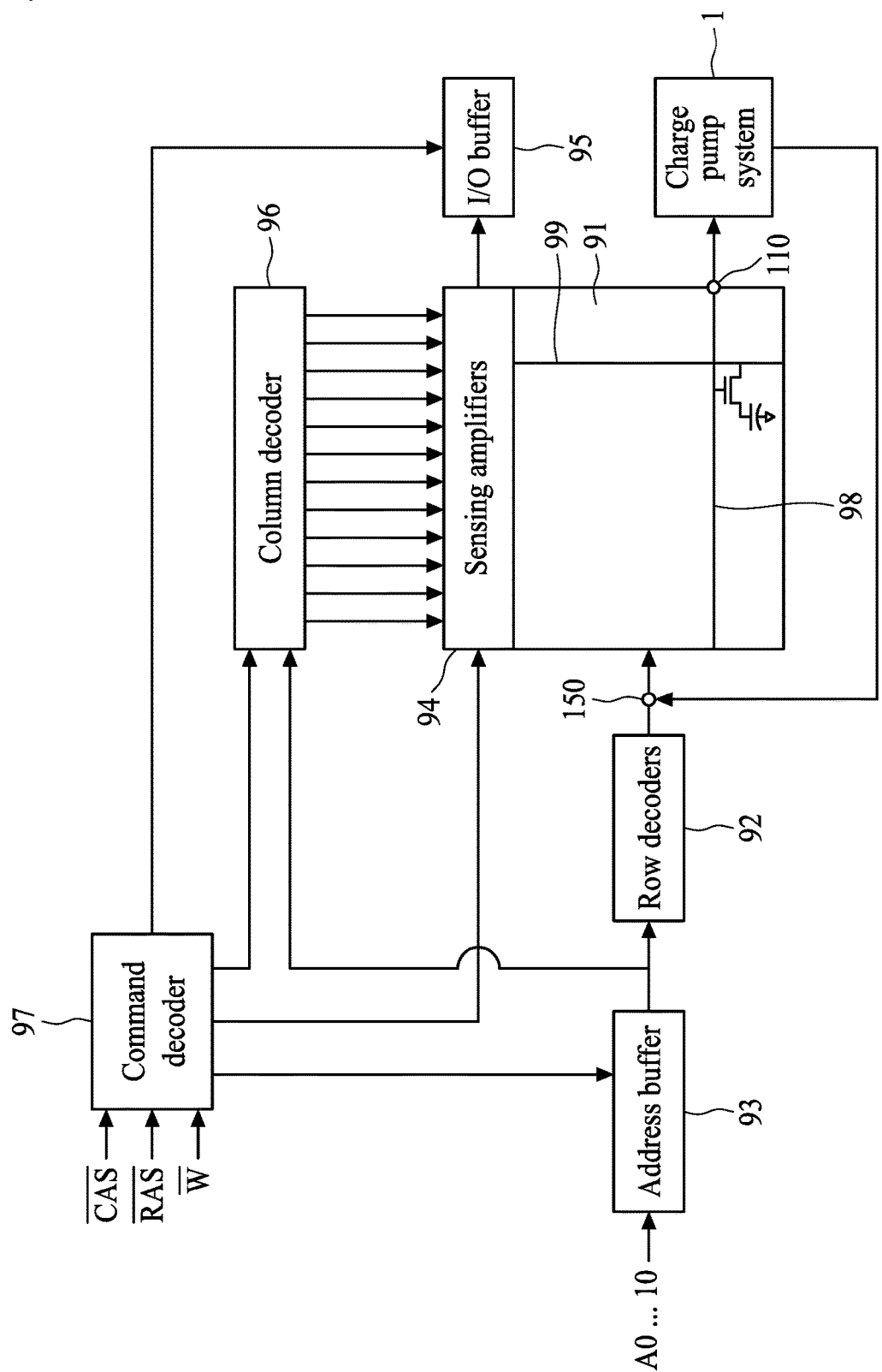
FIG. 1 is a block diagram of a dynamic random access memory (DRAM) in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a dynamic random access memory (DRAM) 9 in accordance with some embodiments of the present disclosure. Referring to FIG. 1, in some embodiments, the DRAM 9 includes a memory array 91, a plurality of row decoders 92, an address buffer 93, a plurality of sensing amplifiers 94, an I/O buffer 95, a plurality of column decoders 96, a command decoder 97, a plurality of word lines 98 and a plurality of bit lines 99. The plurality of row decoders 92 are coupled to the memory array 91. The address buffer 93 is coupled to the plurality of row decoders 92. The plurality of sensing amplifiers 94 are coupled to the memory array 91. The I/O buffer 95 is coupled to the plurality of sensing amplifiers 94. The plurality of column decoders 96 are respectively coupled to the sensing amplifiers 94. The command decoder 97 is coupled to the address buffer 93, the plurality of column decoders 96, the plurality of sensing amplifiers 94 and the I/O buffer 95. The plurality of word lines 98 are disposed in the memory array 91. The plurality of bit lines 99 are disposed in the memory array 91 and intersect the plurality of word lines 98.

Figure 2:
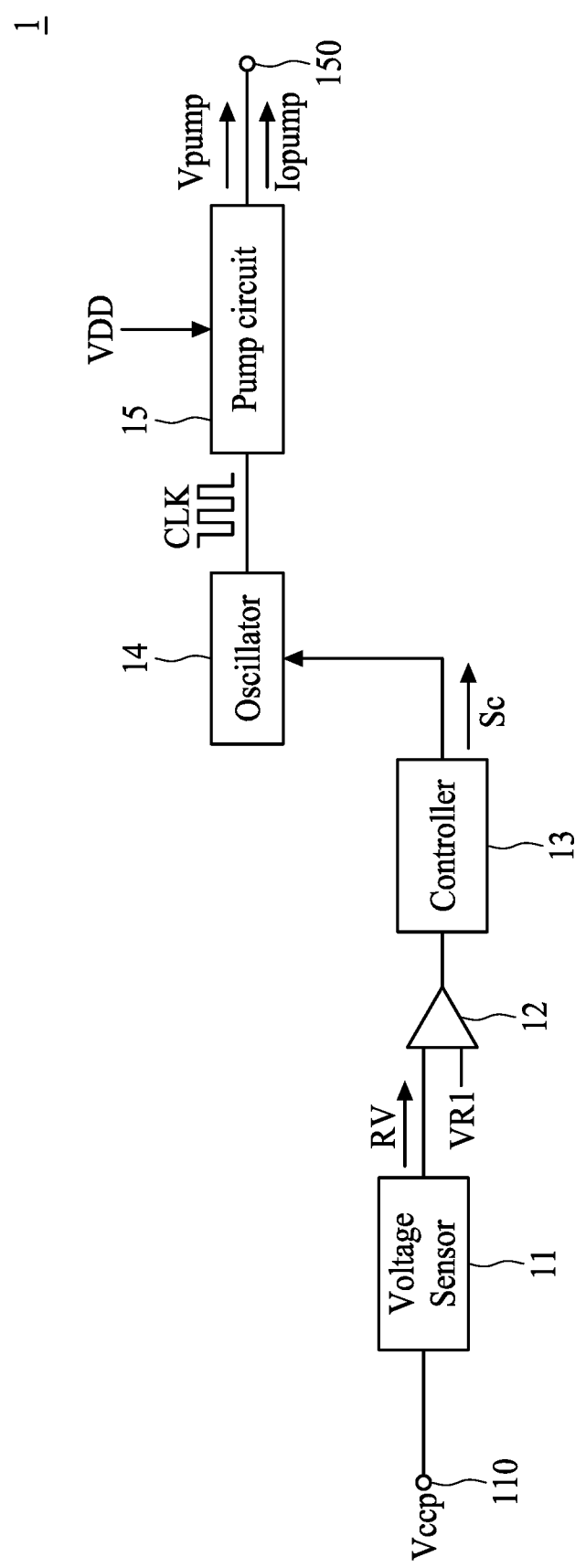
FIG. 2 is a block diagram of a charge pump system of the DRAM in accordance with some embodiments of the present disclosure.

FIG. 2 is a block diagram of a charge pump system 1 of the DRAM 9 in accordance with some embodiments of the present disclosure. Referring to FIG. 2, in some embodiments, the charge pump system 1 is coupled to the plurality of word lines 98 of the DRAM 9. In some embodiments, the charge pump system includes a voltage input 110, a voltage sensor 11, a comparator 12, a controller 13, an oscillator 14, a pump circuit 15 and a pump output 150. The voltage input 110 and the pump output 150 are coupled to the plurality of word lines 98 of the DRAM 9. The voltage sensor 11 measures a word line voltage (Vccp) of the plurality of word lines 98 through the voltage input 110. The comparator 12 is coupled to the voltage sensor 11 and is configured to compare the Vccp with a first reference voltage (VR1). The controller 13 is coupled to the comparator 12 and is configured to send control signals (Sc) based on a voltage comparison information from the comparator 12. The oscillator 14 is coupled to the controller 13 and is configured to send a clock signal (CLK). The pump circuit 15 is coupled to the oscillator 14 and is configured to generate a pump voltage (Vpump) and an overall pump current (Iopump). In some embodiments, when the word line voltage (Vccp) is less than the first reference voltage (VR1), the controller 13 sends a control signal (Sc) to activate the oscillator 14 to send the clock signal (CLK) to the pump circuit 15, and the pump circuit 15 then generates the overall pump current (Iopump) based on an oscillating frequency of the clock signal (CLK). In some embodiments, when the word line voltage (Vccp) is equal to or greater than the first reference voltage (VR1), the controller 13 sends another control signal (Sc) to disable the oscillator 14 from generating the clock signal.

Figure 3:
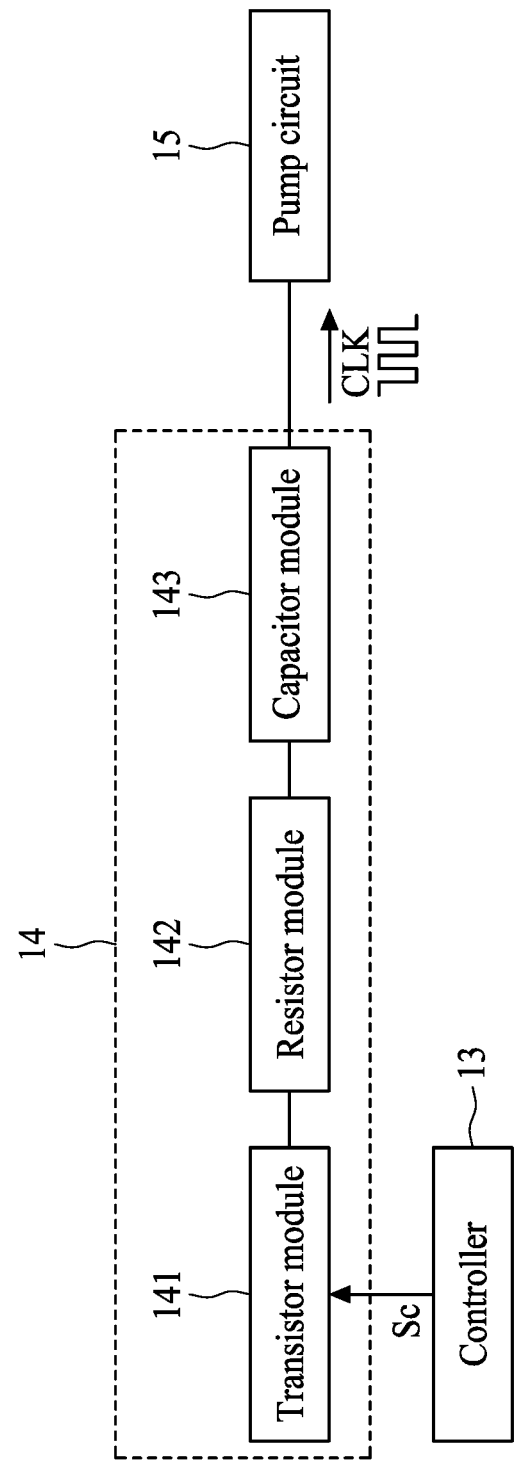
FIG. 3 is a block diagram illustrating an oscillator of the charge pump system in accordance with some embodiments of the present disclosure.

FIG. 3 is a block diagram illustrating the oscillator 14 of the charge pump system 1 in accordance with some embodiments of the present disclosure. Referring to FIG. 3, in some embodiments, the oscillator 14 includes a transistor module 141, a resistor module 142 and a capacitor module 143. The transistor module 141 is coupled to the controller 13 and includes a plurality of transistors. The resistor module 142 is coupled to the transistor module 141 and includes a plurality of resistors. The capacitor module 143 is coupled between the resistor module 142 and the pump circuit 15, and includes a plurality of capacitors. In some embodiments, an RC value of the oscillator 14 is fixed, such that the oscillating frequency of the clock signal is correspondingly fixed. In some embodiments, the RC value of the oscillator 14 is variable, such that the oscillating frequency of the clock signal is correspondingly variable; that is, the RC value of the oscillator 14 is changed by controlling the transistors of the transistor module 141 to adjust a quantity of active resistors of the resistor module 142 and a quantity of active capacitors of the capacitor module 143.

In other embodiments, the resistor module 142 may be omitted; in such embodiments, the transistor module 141 is configured to generate and change a resistance for the oscillator 14.

In other embodiments, when the transistor module 141 is configured to generate and change the resistance for the oscillator 14, the transistors of the transistor module 141 are implemented by a plurality of metal oxide semiconductor field effect transistors (MOSFETs). In other embodiments, each of the transistors includes a gate, a drain and a source, and when the transistors are actuated, each of the transistors has a linear resistance defined as a drain-source on resistance (RDS). In such embodiments, the resistance for the oscillator 14 is implemented by the plurality of RDSs of the transistor module 141.

In other embodiments, since the RDS is controlled by a gate-to-source voltage, the RDS can be changed by adjusting the gate-to-source voltage. Therefore, the resistance of the oscillator 14 can also be changed by adjusting the plurality of gate-to-source voltages of the transistors of the transistor module 141.

Figure 4:
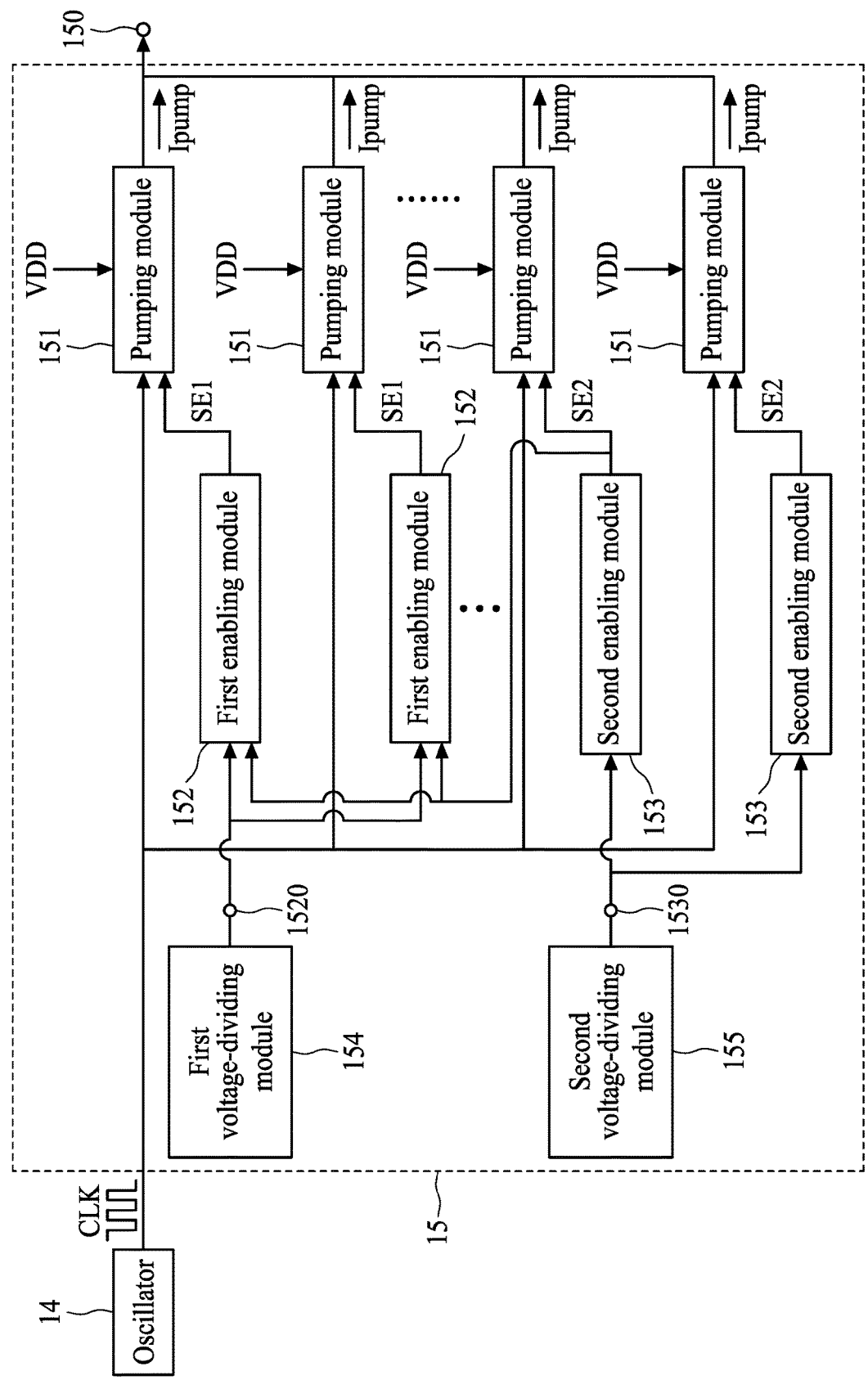
FIG. 4 is a block diagram illustrating a pump circuit of the charge pump system in accordance with some embodiments of the present disclosure.

FIG. 4 is a block diagram illustrating the pump circuit 15 of the charge pump system 1 in accordance with some embodiments of the present disclosure. Referring to FIG. 4, in some embodiments, the pump circuit 15 comprises a plurality of pumping modules 151, a plurality of first enabling modules 152, a plurality of second enabling modules 153, a first voltage-dividing module 154 and a second voltage-dividing module 155.

Referring to FIG. 4, in some embodiments, the plurality of pumping modules 151 are coupled between the oscillator 14 and the pump output 150. In some embodiments, the plurality of first enabling modules 152 are respectively coupled to a portion of the plurality of pumping modules 151. In some embodiments, the plurality of second enabling modules 153 are respectively coupled to the remaining of the plurality of pumping modules 151. In some embodiments, the first voltage-dividing module 154 is coupled to the plurality of first enabling modules 152. In some embodiments, the second voltage-dividing module 155 is coupled to the plurality of second enabling modules 153. In some embodiments, one of the plurality of second enabling modules 153 is coupled to the plurality of first enabling modules 152.

Figure 5:
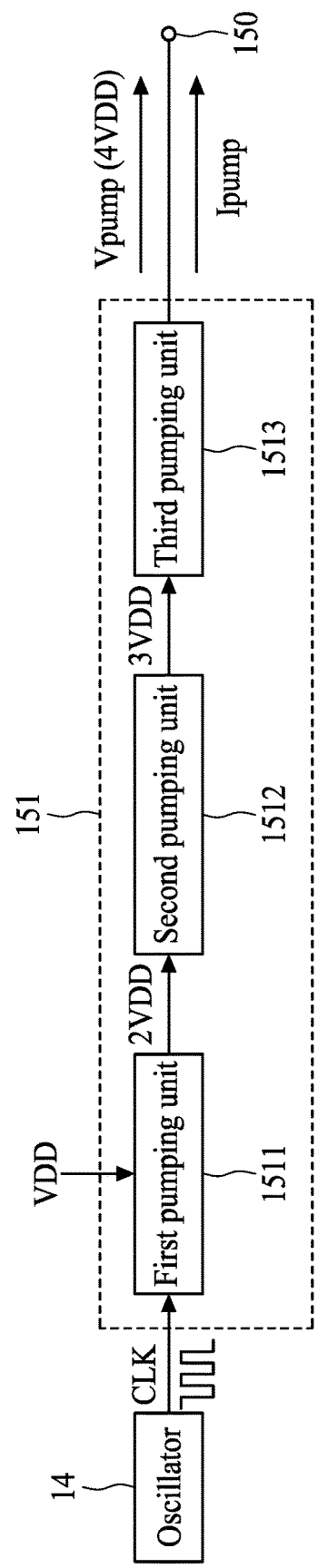
FIG. 5 is a block diagram illustrating a pumping module of the pump circuit in accordance with some embodiments of the present disclosure.

FIG. 5 is a block diagram illustrating the pumping module 151 of the pump circuit 15 in accordance with some embodiments of the present disclosure. Referring to FIG. 5, in some embodiments, each of the plurality of pumping modules 151 is configured to generate the pump voltage (Vpump) and a pump current (Ipump), and each of the plurality of pumping modules 151 includes a first pumping unit 1511 coupled to the oscillator 14, a second pumping unit 1512 coupled to the first pumping unit 1511, and a third pumping unit 1513 coupled between the second pumping unit 1512 and the pump output 150. In some embodiments, the quantity of the pumping units included in each of the plurality of pumping modules 151 may be varied. In some embodiments, a power supply voltage (VDD) provided for the DRAM 9 is pumped in response to the clock signal (CLK) and is increased by equal proportions after sequentially passing through the first pumping unit 1511, the second pumping unit 1512 and the third pumping unit 1513. Therefore, the quantity of the pumping units included in each of the plurality of pumping modules 151 is determined based on a pumping requirement of the pump voltage (Vpump) for the plurality of word lines 98 of the DRAM 9.

Referring to FIG. 5, in some embodiments, since the power supply voltage (VDD) of the DRAM 9 is increased by equal proportions after sequentially passing through each of the three pumping units 1511, 1512 and 1513, a first increased voltage is two times the power supply voltage (VDD) of the DRAM 9 after passing through the first pumping unit 1511, a second increased voltage is three times the power supply voltage (VDD) of the DRAM 9 after passing through the second pumping unit 1512, and a final increased voltage is four times the power supply voltage (VDD) of the DRAM 9 after passing through the third pumping unit 1513 and is configured as the pump voltage (Vpump). In other embodiments, such configuration may be varied.

Figure 6:
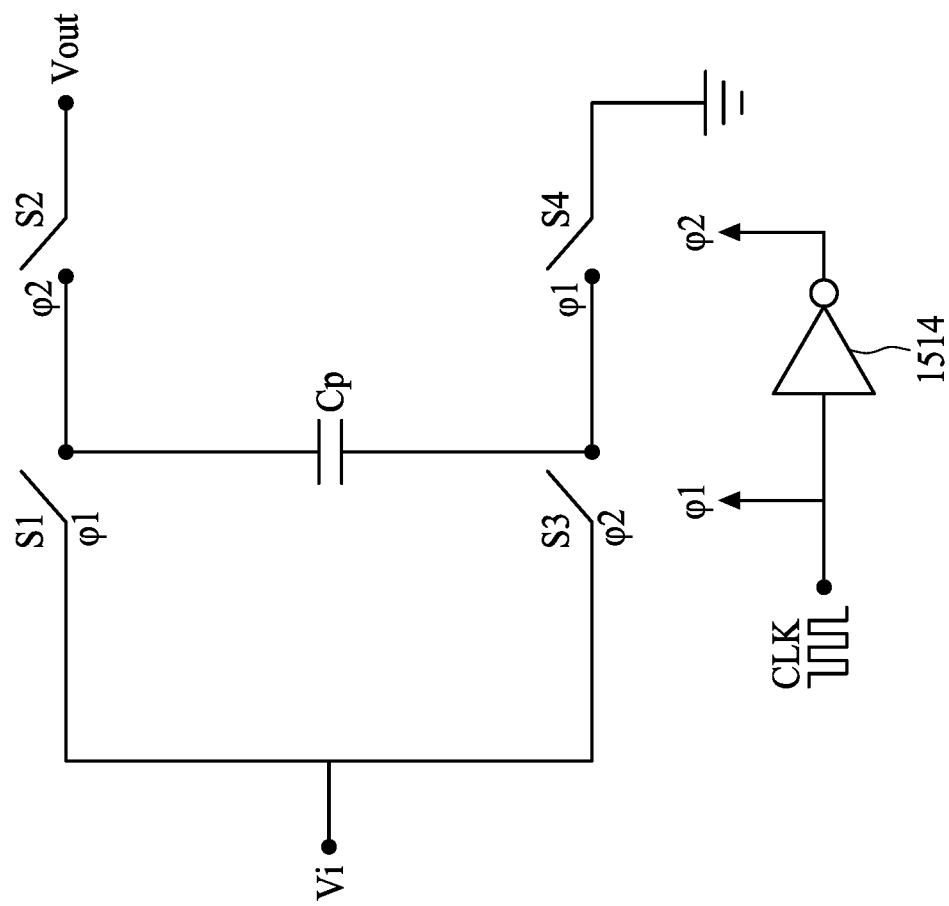
FIG. 6 is a circuit diagram of a pumping unit of the pumping module in accordance with some embodiments of the present disclosure.

FIG. 6 is a circuit diagram of a pumping unit of the pumping module 151 in accordance with some embodiments of the present disclosure. Referring to FIG. 6, in some embodiments, each of the first, second and third pumping units 1511, 1512 and 1513 includes a first switch (S1), a second switch (S2), a third switch (S3), a fourth switch (S4), a pumping capacitor (Cp) and a logic gate 1514.

Referring to FIG. 6, during a pumping process of each of the first, second and third pumping units 1511, 1512 and 1513, in some embodiments, in the first half cycle, a clock phase goes to $\varphi 1$, the first switch (S1) and the fourth switch (S4) are closed, the second switch (S2) and the third switch (S3) are open, and the pumping capacitor (Cp) is charged to have a voltage equal to an input voltage (Vi). In some embodiments, in the second half cycle, the clock phase goes to $\varphi 2$, the first switch (S1) and the fourth switch (S4) are open, the second switch (S2) and the third switch (S3) are closed, and an output voltage (Vout) is two times the input voltage (Vi) (for example, Vout=Vi(input)+Vi(charged in Cp)).

Referring to FIG. 6, in some embodiments, the logic gate 1514 is configured to drive a periodic switching of the clock phase ($\varphi 1$ and $\varphi 2$), and the switching frequency of the clock phase ($\varphi 1$ and $\varphi 2$) is determined based on the oscillating frequency of the clock signal. In some embodiments, the logic gate 1514 is configured as an inverter, while in other embodiments, the configuration of the logic gate 1514 may be varied.

Figure 7:
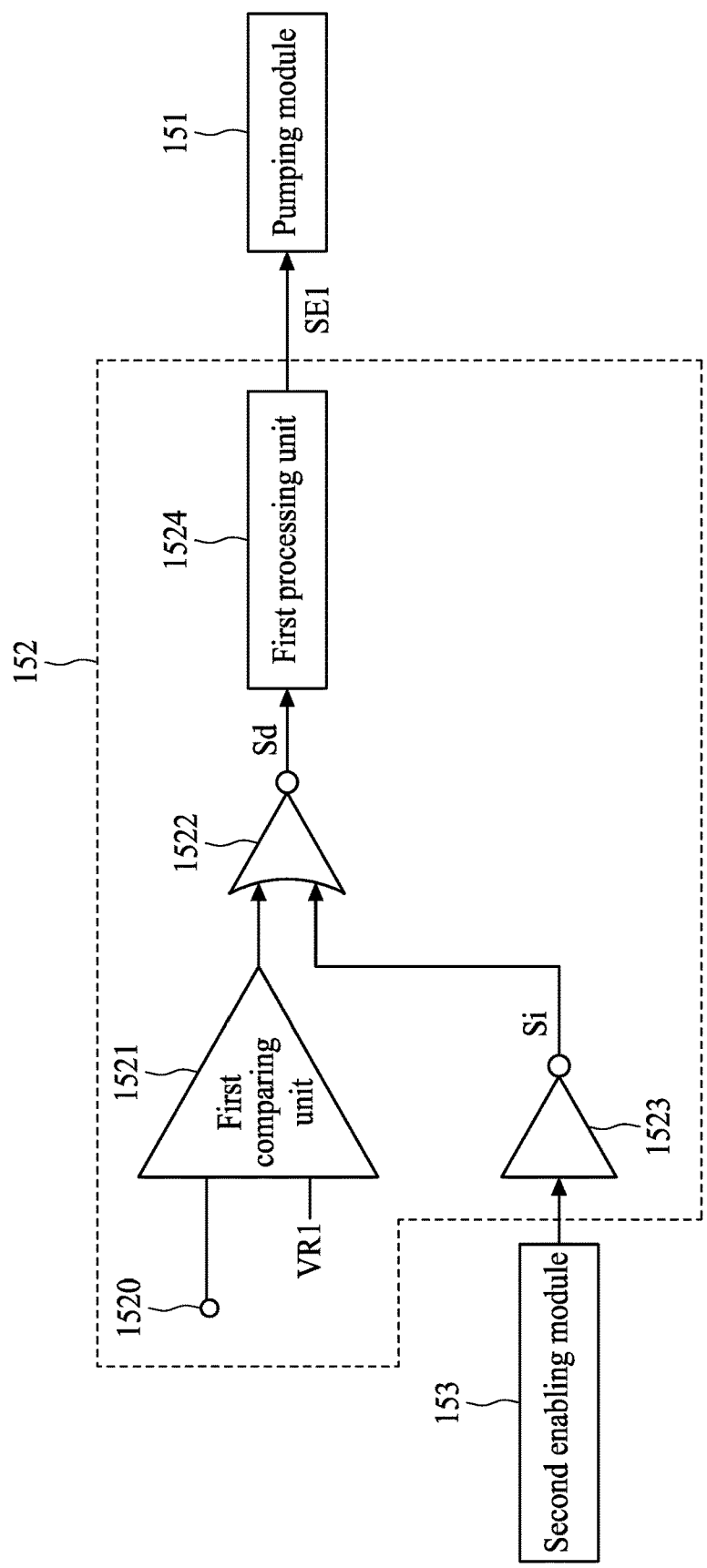
FIG. 7 is a block diagram illustrating a first enabling module of the pump circuit in accordance with some embodiments of the present disclosure.

FIG. 7 is a block diagram illustrating the first enabling module 152 of the pump circuit 15 in accordance with some embodiments of the present disclosure. Referring to FIG. 7, in some embodiments, each of the plurality of first enabling modules 152 is configured to generate a first enable signal (SE1) and includes a first voltage input 1520, a first comparing unit 1521, a first digital logic gate 1522, a second digital logic gate 1523 and a first processing unit 1524.

Referring to FIG. 7, in some embodiments, the first comparing unit 1521 is coupled to the first voltage input 1520, which is further coupled to the first voltage-dividing module 154 (see FIG. 4). The first comparing unit 1521 is configured to compare a voltage of the first voltage input 1520 with the first reference voltage (VR1). The first digital logic gate 1522 is coupled to the first comparing unit 1521 and is configured to implement a logical operation. The second digital logic gate 1523 is coupled to the first digital logic gate 1522 and is configured to implement a logical negation. The first processing unit 1524 is coupled between the first digital logic gate 1522 and a corresponding one of the plurality of pumping modules 151. The first processing unit 1524 is configured to generate the first enable signal (SE1) based on a result of the logical operation of the first digital logic gate 1522.

Referring to FIG. 7, in some embodiments, each of the plurality of first enabling modules 152 generates the first enable signal (SE1) when the voltage of the first voltage input 1520 is less than the first reference voltage (VR1).

Referring to FIG. 7, in some embodiments, the first digital logic gate 1522 is configured as a NOR gate, while the configuration of the first digital logic gate 1522 may be varied in other embodiments. In some embodiments, the second digital logic gate 1523 is configured as an inverter, while the configuration of the second digital logic gate 1523 may be varied in other embodiments.

Figure 8:
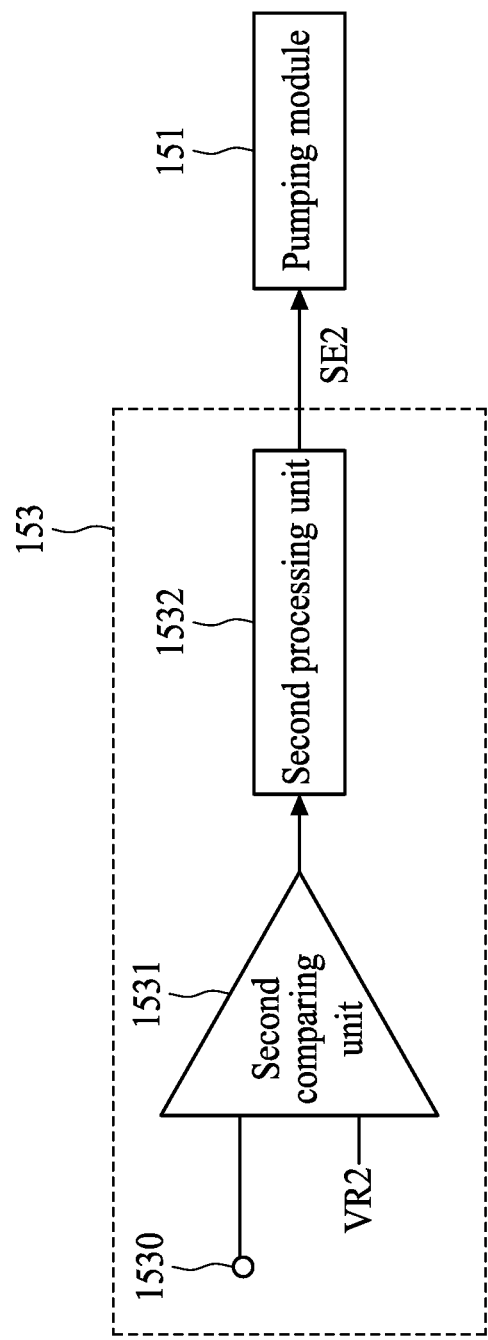
FIG. 8 is a block diagram illustrating a second enabling module of the pump circuit in accordance with some embodiments of the present disclosure.

FIG. 8 is a block diagram illustrating the second enabling module 153 of the pump circuit 15 in accordance with some embodiments of the present disclosure. Referring to FIG. 8, in some embodiments, each of the plurality of second enabling modules 153 is configured to generate a second enable signal (SE2) and includes a second voltage input 1530, a second comparing unit 1531 and a second processing unit 1532.

Referring to FIG. 8, in some embodiments, the second comparing unit 1531 is coupled to the second voltage input 1530, which is further coupled to the second voltage-dividing module 155 (see FIG. 4). In some embodiments, the second comparing unit 1531 is configured to compare a voltage of the second voltage input 1530 with a second reference voltage (VR2). In some embodiments, the second processing unit 1532 is coupled between the second comparing unit 1531 and a corresponding one of the plurality of pumping modules 151. In some embodiments, the second processing unit 1532 is configured to generate the second enable signal (SE2) based on a comparison result from the second comparing unit 1531.

Referring to FIG. 8, in some embodiments, each of the plurality of second enabling modules 153 generates the second enable signal (SE2) when the voltage of the second voltage input 1530 is less than the second reference voltage (VR2).

Figure 9:
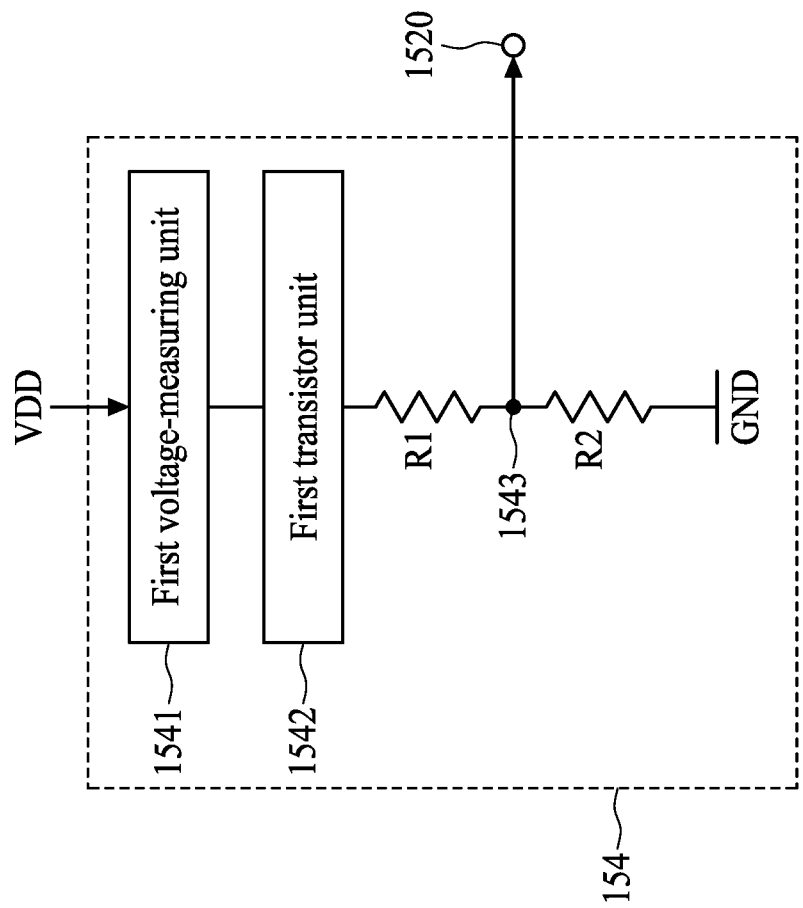
FIG. 9 is a circuit diagram illustrating a first voltage-dividing module of the pump circuit in accordance with some embodiments of the present disclosure.

FIG. 9 is a circuit diagram illustrating the first voltage-dividing module 154 of the pump circuit 15 in accordance with some embodiments of the present disclosure. Referring to FIG. 9, in some embodiments, the first voltage-dividing module 154 is coupled to the plurality of first enabling modules 152 (see FIG. 4) and is configured to convert the power supply voltage (VDD) to the voltage of the first voltage input 1520 for each of the plurality of first enabling modules 152. In some embodiments, the first voltage-dividing module 154 includes a first voltage-measuring unit 1541, a first transistor unit 1542 and a plurality of first dividing resistors.

Referring to FIG. 9, in some embodiments, the first voltage-measuring unit 1541 is configured to measure the power supply voltage (VDD). In some embodiments, the first transistor unit 1542 is coupled between the first voltage-measuring unit 1541 and the plurality of first dividing resistors. In some embodiments, the first transistor unit 1542 is configured to complementarily adjust resistances of the plurality of first dividing resistors. In some embodiments, the first voltage input 1520 of each of the plurality of first enabling modules 152 is coupled to a node 1543 that is between a corresponding pair of the plurality of first dividing resistors.

Referring to FIG. 9, in some embodiments, the first transistor unit 1542 includes a plurality of first transistors, each having an RDS. The RDS of each of the plurality of first transistors can be changed by adjusting a gate-to-source voltage of a corresponding one of the plurality of first transistors.

Referring to FIG. 9, in some embodiments, the first voltage-dividing module 154 includes two first dividing resistors (R1 and R2), and the first voltage input 1520 of each of the plurality of first enabling modules 152 is coupled to the node 1543 that is between the two first dividing resistors (R1 and R2). In some embodiments, resistances of the two first dividing resistors (R1 and R2) are the same, while, in other embodiments, the resistances of the two first dividing resistors (R1 and R2) may be different from each other.

Figure 10:
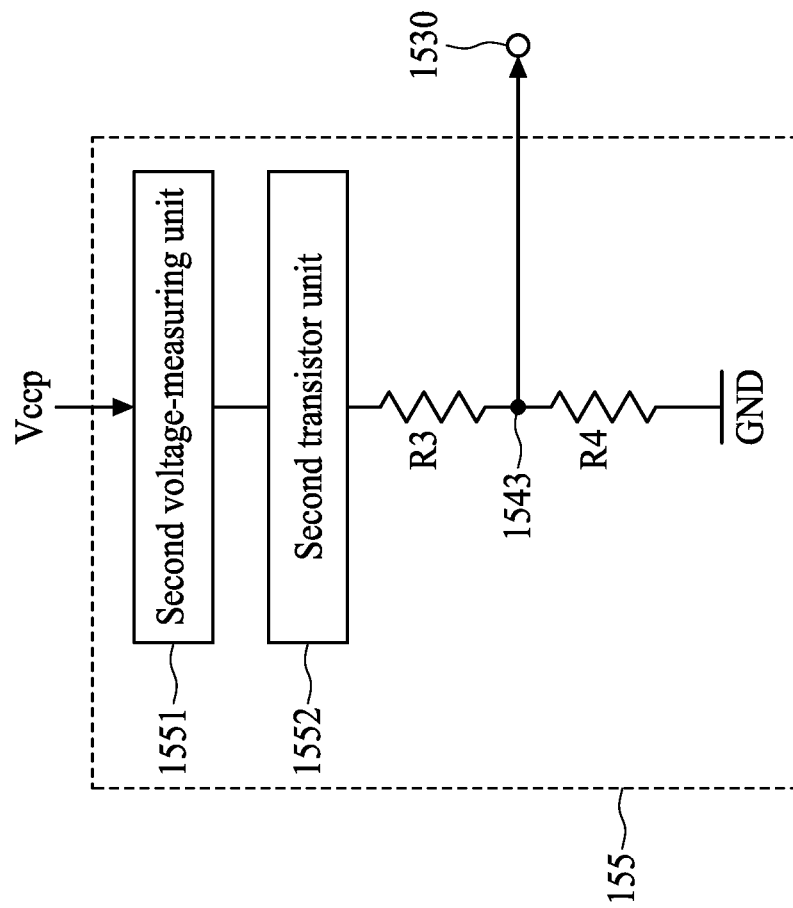
FIG. 10 is a circuit diagram illustrating a second voltage-dividing module of the pump circuit in accordance with some embodiments of the present disclosure.

FIG. 10 is a circuit diagram illustrating the second voltage-dividing module 155 of the pump circuit 15 in accordance with some embodiments of the present disclosure. Referring to FIG. 10, in some embodiments, the second voltage-dividing module 155 is coupled to the plurality of second enabling modules 153 (see FIG. 4) and is configured to convert the word line voltage (Vccp) to the voltage of the second voltage input 1530 for each of the plurality of second enabling modules 153. In some embodiments, the second voltage-dividing module 155 includes a second voltage-measuring unit 1551, a second transistor unit 1552 and a plurality of second dividing resistors.

Referring to FIG. 10, in some embodiments, the second voltage-measuring unit 1551 is configured to measure the word line voltage (Vccp). In some embodiments, the second transistor unit 1552 is coupled between the second voltage-measuring unit 1551 and the plurality of second dividing resistors. In some embodiments, the second transistor unit 1552 is configured to complementarily adjust resistances of the plurality of second dividing resistors. In some embodiments, the second voltage input 1530 of each of the plurality of second enabling modules 153 is coupled to a node 1553 that is between a corresponding pair of the plurality of second dividing resistors.

Referring to FIG. 10, in some embodiments, the second transistor unit 1552 includes a plurality of second transistors, each having an RDS. The RDS of each of the plurality of second transistors can be changed by adjusting a gate-to-source voltage of a corresponding one of the plurality of second transistors.

Referring to FIG. 10, in some embodiments, the second voltage-dividing module 155 includes two second dividing resistors (R3 and R4), and the second voltage input 1530 of each of the plurality of second enabling modules 153 is coupled to the node 1553 that is between the two second dividing resistors (R3 and R4). In some embodiments, resistances of the two second dividing resistors (R3 and R4) are the same, while, in other embodiments, the resistances of the two second dividing resistors (R3 and R4) may be different from each other.

In some embodiments, the resistances of the two first dividing resistors (R1 and R2) in FIG. 9 are the same as the resistances of the two second dividing resistors (R3 and R4) in FIG. 10. In other embodiments, the resistances of the two first dividing resistors (R1 and R2) may be different from the resistances of the two second dividing resistors (R3 and R4).

Figure 11:
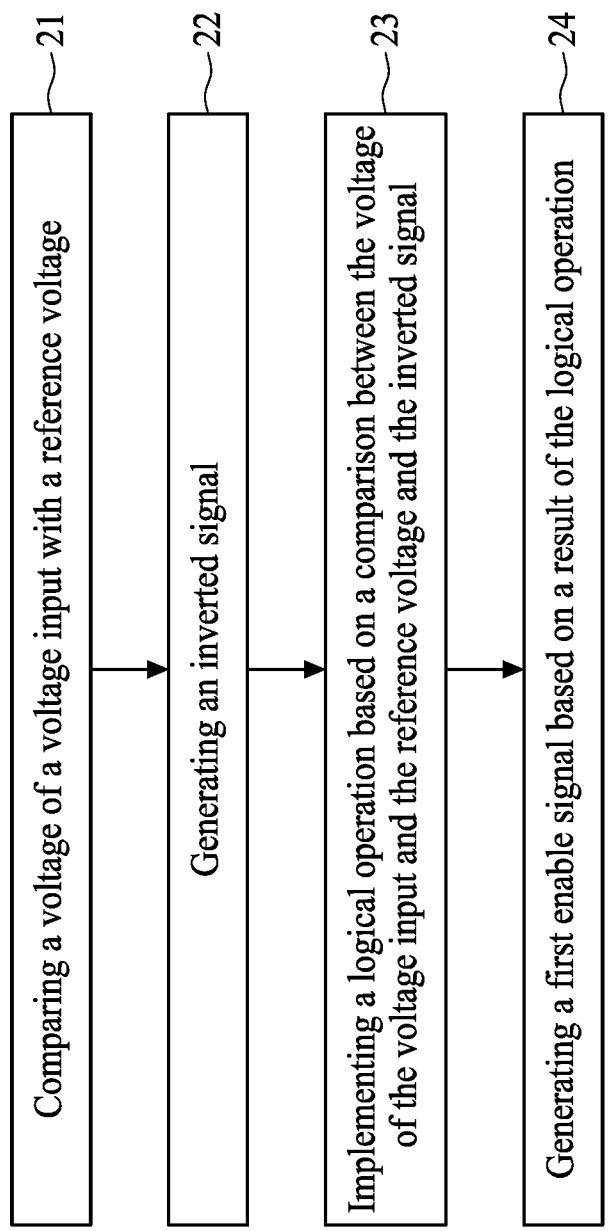
FIG. 11 is a flowchart illustrating a method for controlling an overall pump current in accordance with some embodiments of the present disclosure.

FIG. 11 is a flowchart illustrating a method 2 for controlling the overall pump current (Iopum) in accordance with some embodiments of the present disclosure. Referring to FIG. 11, in some embodiments, the method 2 comprises a step 21, in which the voltage of the first voltage input 1520 is compared with the first reference voltage (VR1); a step 22, in which an inverted signal (Si) is generated; a step 23, in which the logical operation is implemented based on a comparison between the voltage of the first voltage input 1520, the first reference voltage (VR1) and the inverted signal (Si); and a step 24, in which the first enable signal (SE1) is generated based on the result of the logical operation.

Referring back to FIG. 2, in some embodiments, during a pumping process, the voltage sensor 11 measures the word line voltage (Vccp) of the plurality of word lines 99 and sends a voltage record (RV) to the comparator 12. The comparator 12 then compares the voltage record (RV) with the first reference voltage (VR1), and sends a voltage comparison record to the controller 13. Next, if the word line voltage (Vccp) is less than the first reference voltage (VR1), then the controller 13 sends the control signal (Sc) to the oscillator 14 to generate the clock signal (CLK), and if the word line voltage (Vccp) is equal to or greater than the first reference voltage (VR1), then the controller 13 sends the control signal (Sc) to the oscillator 14 to stop generating the clock signal (CLK). Subsequently, referring to FIG. 4, if the word line voltage (Vccp) is less than the first reference voltage (VR1), then the plurality of first enabling modules 152 and the plurality of second enabling modules 153 send the plurality of first enable signals (SE1) and the plurality of second enable signals (SE2) to actuate the plurality of pumping modules 151.

Figure 12A:
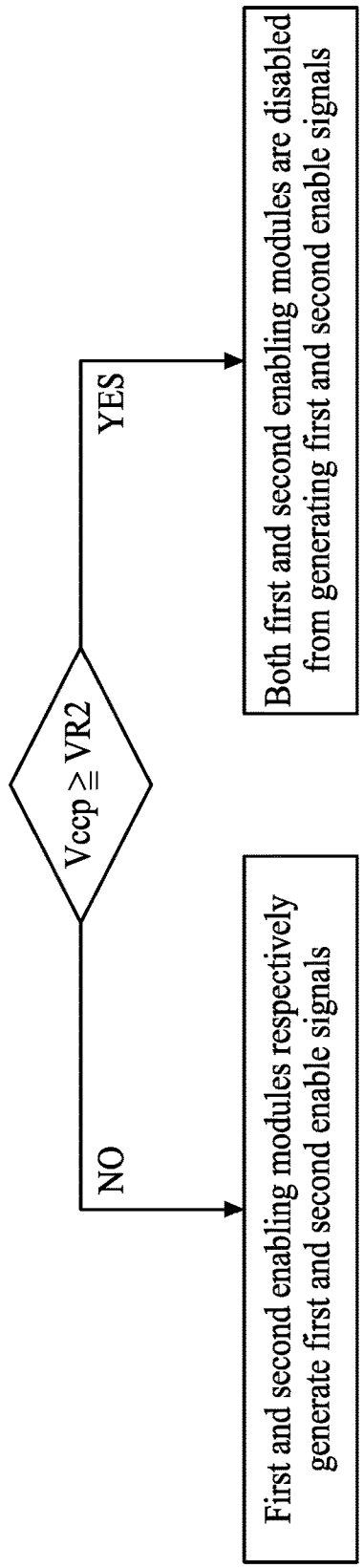
FIG. 12A is a decision flowchart illustrating a timing when the first enabling module and the second enabling module respectively generate a first enable signal and a second enable signal.
Figure 12B:
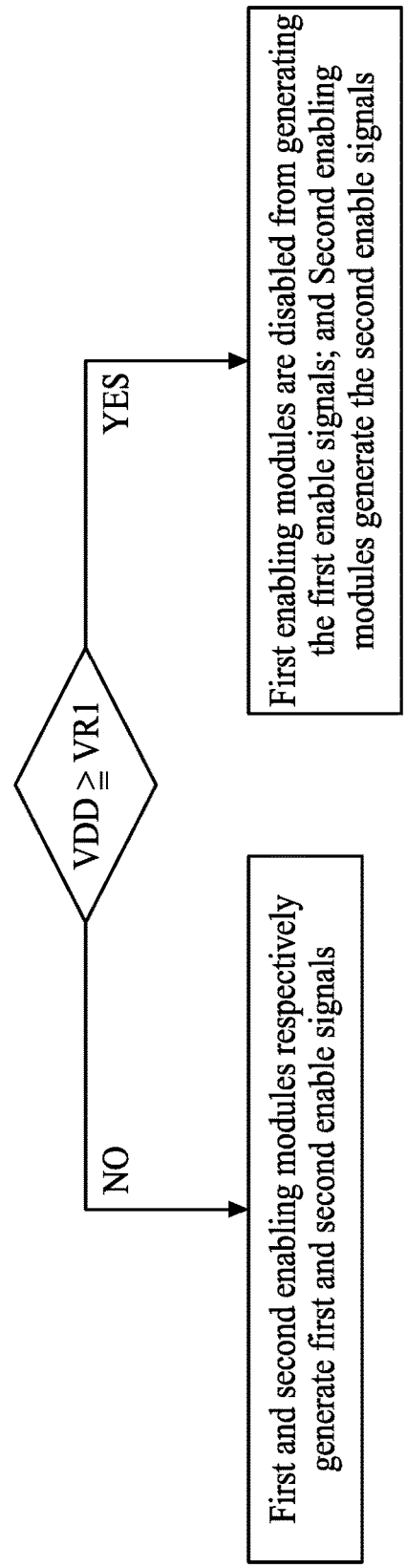
FIG. 12B is a decision flowchart illustrating a timing when the first enabling module is disabled from generating the first enable signal.

FIG. 12A is a decision flowchart illustrating a timing when the first enabling module 152 and the second enabling module 153 respectively generate the first enable signal (SE1) and the second enable signal (SE2). FIG. 12B is a decision flowchart illustrating a timing when the first enabling module 152 is disabled from generating the first enable signal (SE1). Referring to FIG. 12A, in some embodiments, when the word line voltage (Vccp) is less than the second reference voltage (VR2), it is indicated that the word line voltage (Vccp) is not high enough to activate a plurality of rows included in the memory array 91 (see FIG. 1). In such case, the pump circuit 15 is required to generate the pump voltage (Vpump) and the overall pump current (Iopump) for the plurality of word lines 98 (see FIG. 2), and the first and second enabling modules 152 and 153 therefore generate the first and second enable signals (SE1 and SE2) to actuate the plurality of pumping modules 151 (see FIG. 4). In some embodiments, when the word line voltage (Vccp) is equal to or greater than the second reference voltage (VR2), it is indicated that the word line voltage (Vccp) is high enough to activate the plurality of rows included in the memory array 91. In such case, the pump circuit 15 is not required to generate the pump voltage (Vpump) and the overall pump current (Iopump) for the plurality of word lines 98, and the plurality of first and second enabling modules 152 and 153 are thereby disabled from generating the plurality of first and second enable signals (SE1 and SE2).

Referring to FIG. 12B, in some embodiments, during the pumping process, electrical overstress (EOS) damage may occur if the power supply voltage (VDD) is excessive. In addition, when the power supply voltage (VDD) is less than the first reference voltage (VR1), the plurality of first and second enabling modules 152 and 153 respectively generate the plurality of first and second enable signals (SE1 and SE2) to actuate all of the plurality of pumping modules 151. In some embodiments, when the power supply voltage (VDD) is equal to or greater than the first reference voltage (VR1), in order to prevent the EOS damage, the plurality of first enabling modules 152 are disabled from generating the plurality of first enable signals (SE1). In such case, only the remaining of the plurality of pumping modules 151 which are respectively enabled by the plurality of second enabling modules 153 cooperatively generate the pump voltage (Vpump) and the overall pump current (Iopump), and a value of the overall pump current (Iopump) is thereby decreased.

FIG. 13 is a truth table of the logical operation of the first digital logic gate 1522 of the second enabling module 152 in accordance with some embodiments of the present disclosure. Referring to FIG. 13, in some embodiments, since the first digital logic gate 1522 of each of the plurality of second enabling modules 152 is configured as the NOR gate (see FIG. 7), an output signal is true only when both a first input signal and a second input signal are false. Otherwise, the output signals are false.

FIG. 14 is a truth table of the logical negation of the second digital logic gate 1523 of the second enabling module 152 in accordance with some embodiments of the present disclosure. Referring to FIG. 14, in some embodiments, since the second digital logic gate 1523 of each of the plurality of second enabling modules 152 is configured as the inverter (see FIG. 7), when an input signal is true, an output signal is false, and when the input signal is false, the output signal is true.

Referring back to FIG. 7, in some embodiments, during a first enable signal-generating process, if the word line voltage (Vccp) is less than the second reference voltage (VR2), then one of the plurality of second enabling modules 153 sends the second enable signal (SE2), which has a value of true, to each of the plurality of first enabling modules 152. Next, for each of the plurality of first enabling modules 152, the second digital logic gate 1523 sends the inverted signal (Si), which has a value of false (see FIG. 14), to the first digital logic gate 1522. Next, the first comparing unit 1521 compares the voltage of the first voltage input 1520 with the first reference voltage (VR1), and sends a first voltage comparison record to the first digital logic gate 1522. When the voltage of the first voltage input 1520 is less than the first reference voltage (VR1), the first voltage comparison record of the first comparing unit 1521 indicates false, and when the voltage of the first voltage input 1520 is equal to or greater than the first reference voltage (VR1), the first voltage comparison record of the first comparing unit 1521 indicates true. Next, the first digital logic gate 1522 generates a digital signal (Sd) based on the inverted signal (Si) and the first voltage comparison record of the first comparing unit 1521. Subsequently, the first processing unit 1524 generates the first enable signal (SE1) if the digital signal (Sd) is true.

Referring to FIG. 8, in some embodiments, during a second enable signal-generating process, for each of the plurality of second enabling modules 153, the second comparing unit 1531 first compares the voltage of the second voltage input 1530 with the second reference voltage (VR2). Next, the second comparing unit 1531 generates another voltage comparison record for the second processing unit 1532. Subsequently, the second processing unit 1532 generates the second enable signal (SE2) if the voltage of the second voltage input 1531 is less than the second reference voltage (VR2).

Figure 15:
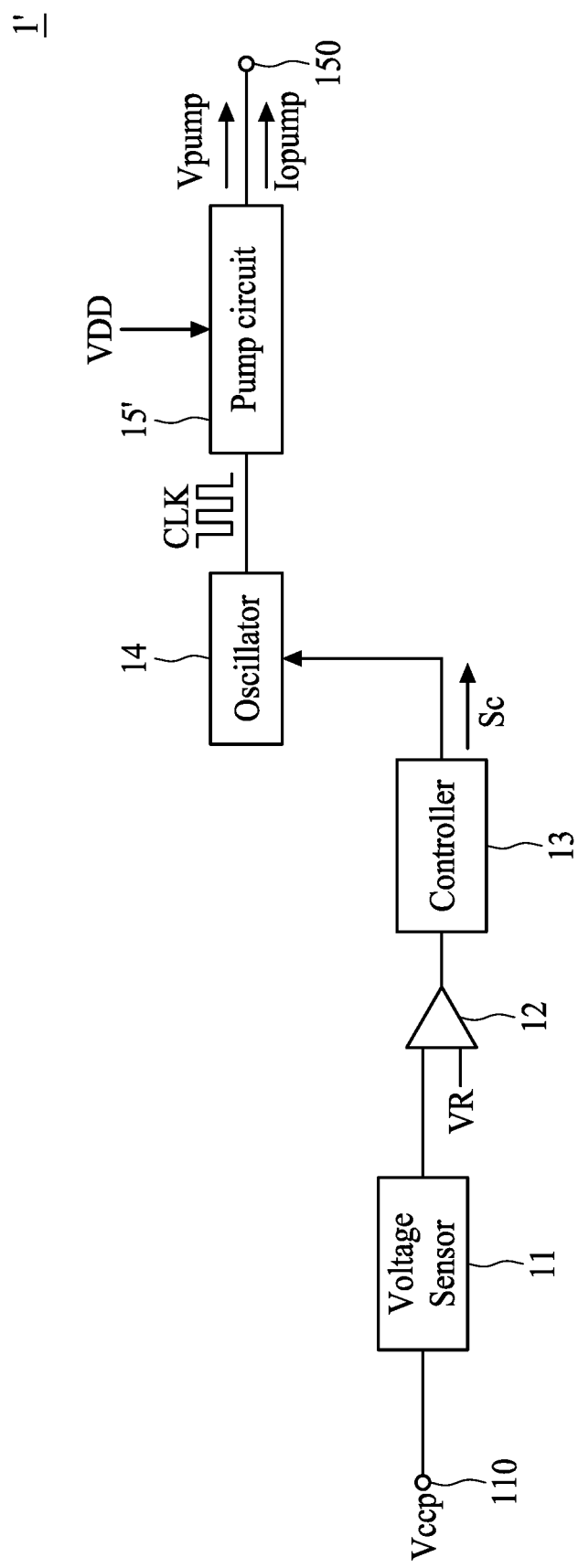
FIG. 15 is a block diagram of a comparative charge pump system.

FIG. 15 is a block diagram of a comparative charge pump system 1'. Referring to FIG. 15, the comparative charge pump system 1' is substantially similar to the charge pump system 1 of the present disclosure in FIG. 2 except for differences in the pump circuit 15'.

Figure 16:
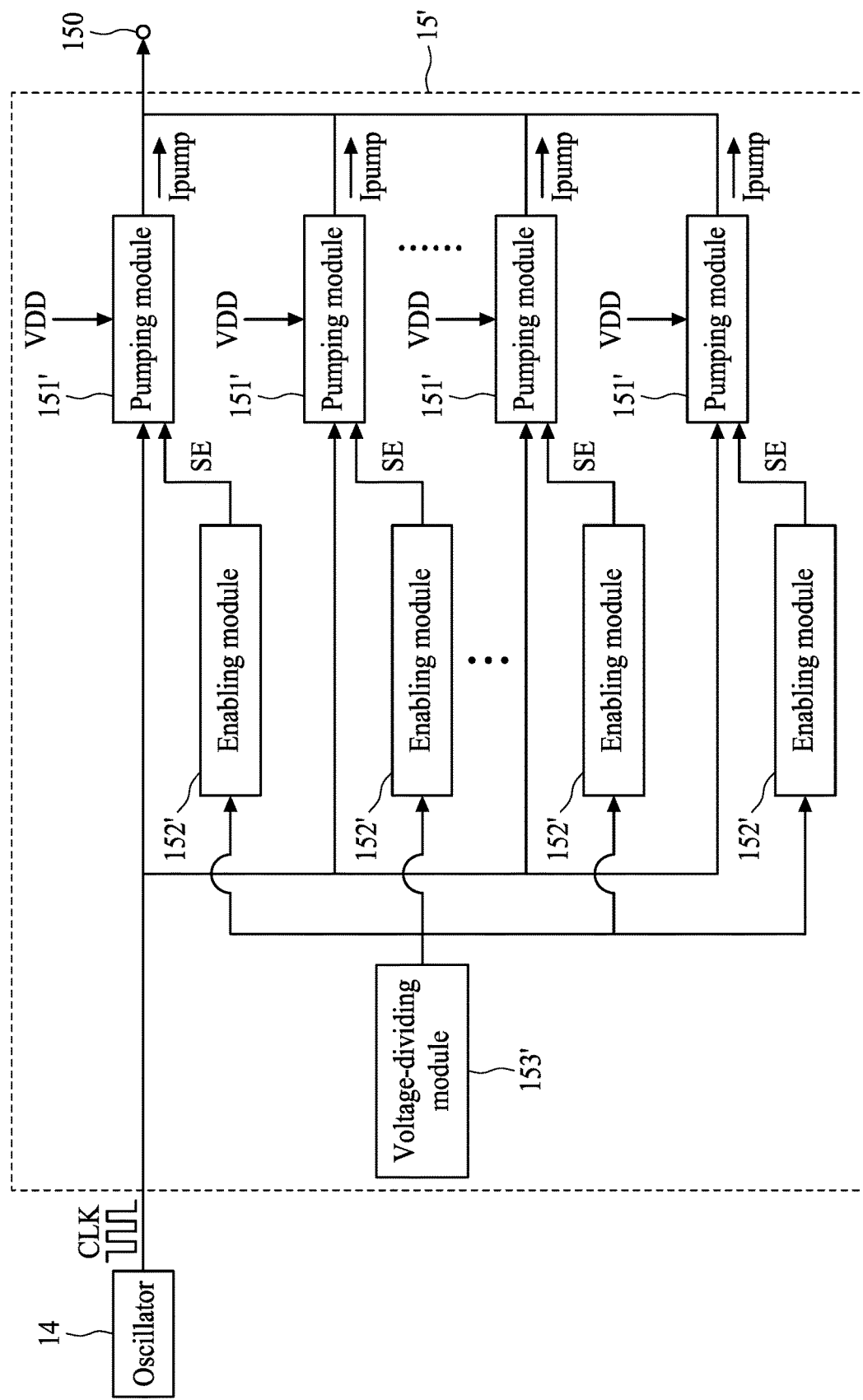
FIG. 16 is a block diagram illustrating a pump circuit of the comparative charge pump system.

FIG. 16 is a block diagram illustrating a pump circuit 15' of the comparative charge pump system 1'. Referring to FIG. 16, the pump circuit 15' includes a plurality of pumping modules 151', which are the same as the plurality of pumping modules 151 of the present disclosure in FIG. 4; a plurality of enabling modules 152' respectively coupled to the plurality of pumping modules 151'; and a voltage-dividing module 153' coupled to the plurality of enabling modules 152'.

Figure 17:
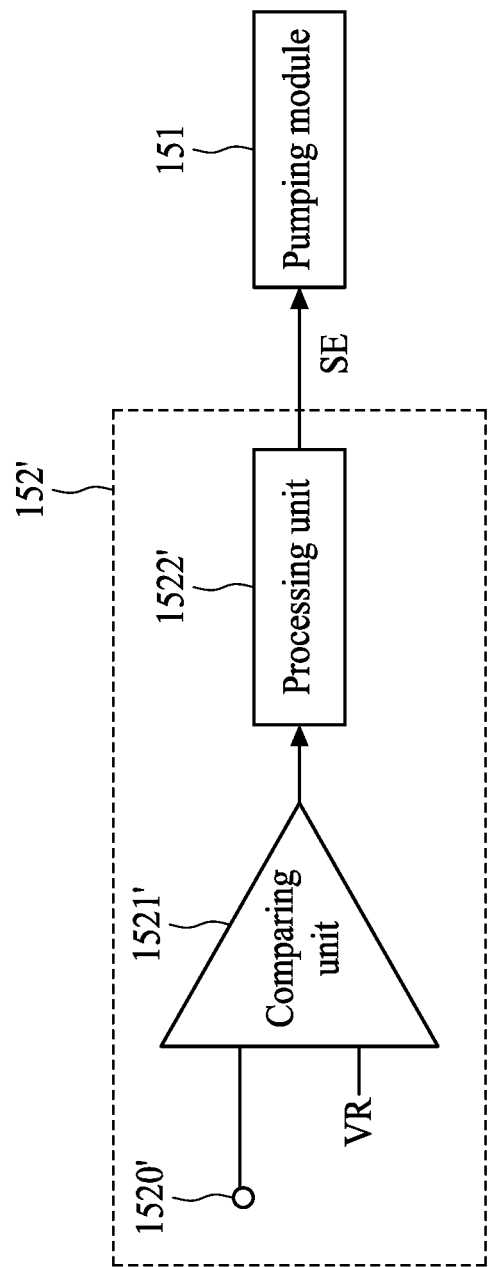
FIG. 17 is a block diagram illustrating an enabling module of the pump circuit of the comparative charge pump system.

FIG. 17 is a block diagram illustrating the enabling module 152' of the pump circuit 15' of the comparative charge pump system 1'. Referring to FIG. 17, each of the plurality of enabling modules 152' includes a voltage input 1520', a comparing unit 1521' and a processing unit 1522'. The comparing unit 1521' is coupled to the voltage input 1520', which is further coupled to the voltage-dividing module 153' (see FIG. 16). The comparing unit 1521' is configured to compare a voltage of the voltage input 1520' with a reference voltage (VR) and to generate a voltage comparison record. The processing unit 1522' is coupled between the comparing unit 1521' and a corresponding one of the plurality of pumping modules 151'. The processing unit 1522' is configured to generate an enable signal (SE) based on the voltage comparison record of the comparing unit 1521'. The processing unit 1522' generates the enable signal (SE) when the voltage of the voltage input 1520' is less than the reference voltage (VR).

Figure 18:
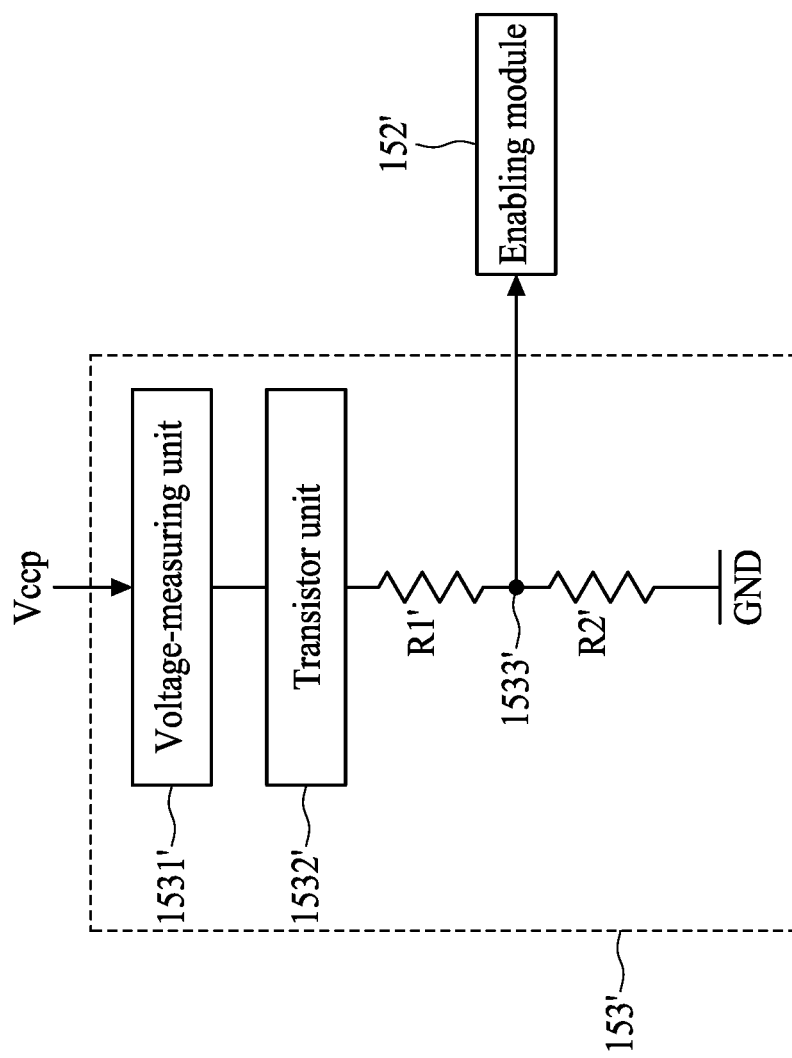
FIG. 18 is a circuit diagram illustrating a voltage-dividing module of the pump circuit of the comparative charge pump system.

FIG. 18 is a circuit diagram illustrating the voltage-dividing module 153' of the pump circuit 15' of the comparative charge pump system 1'. Referring to FIG. 18, the voltage-dividing module 153' includes a voltage-measuring unit 1531', a transistor unit 1532' and two dividing resistors (R1' and R2'). The voltage-measuring unit 1531' is configured to measure the word line voltage (Vccp). The transistor unit 1532' is coupled between the voltage-measuring unit 1531' and the two dividing resistors (R1' and R2'). The transistor unit 1532' is configured to complementarily adjust resistances of the two dividing resistors (R1' and R2'). The voltage input 1520' of each of the plurality of enabling modules 152' is coupled to a node 1533' that is between the two dividing resistors (R1' and R2'). The resistances of the two dividing resistors (R1' and R2') are the same.

The transistor unit 1532' includes a plurality of transistors, each having an RDS. The RDS of each of the plurality of transistors can be changed by adjusting a gate-to-source voltage of a corresponding one of the plurality of transistors.

During a pumping process of the pump circuit 15' of the comparative charge pump system 1', the word line voltage (Vccp) is first divided by the voltage-dividing module 153' to be the same as the voltage of the voltage input 1520' (see FIG. 18). Next, for each of the plurality of enabling modules 152', the comparing unit 1521' compares the voltage of the voltage input 1520' with the reference voltage (VR), and sends the voltage comparison record to the processing unit 1522' (see FIG. 17). The processing unit 1522' then sends the enable signal (SE) to actuate the corresponding one of the pumping modules 151' when the voltage of the voltage input 1520' is less than the reference voltage (VR) (see FIG. 16).

With the pump circuit 15' of the comparative charge pump system 1', during the pumping process, the plurality of pumping modules 151' are enabled or disabled together. Therefore, when the VDD is excessive, the EOS damage may occur because the overall pump current (Iopump) generated by the pump circuit 15' can't be decreased. In contrast, with the pump circuit 15 of the present disclosure, during the pumping process, when the VDD is excessive, the portion of the plurality of pumping modules 151 are not enabled. Therefore, the EOS damage won't occur since the overall pump current (Iopump) generated by the pump circuit 15 is decreased.

In conclusion, with the configuration of the pump circuit 15, the overall pump current (Iopump) generated by the pump circuit 15 is controllable. As a result, the electrical overstress (EOS) damage can be prevented.

One aspect of the present disclosure provides a pump circuit. In some embodiments, the pump circuit includes a plurality of pumping modules and a plurality of first enabling modules. In some embodiments, each of the plurality of pumping modules is configured to generate a pump current. In some embodiments, the plurality of first enabling modules are respectively coupled to a portion of the plurality of pumping modules. In some embodiments, each of the plurality of first enabling modules is configured to generate a first enable signal. In some embodiments, each of the plurality of first enabling modules includes a first voltage input, a first comparing unit, a first digital logic gate and a second digital logic gate. In some embodiments, the first comparing unit is coupled to the first voltage input and is configured to compare a voltage of the first voltage input with a first reference voltage. In some embodiments, the first digital logic gate is coupled to the first comparing unit and is configured to implement a logical operation. In some embodiments, the second digital logic gate is coupled to the first digital logic gate and is configured to implement a logical negation. In some embodiments, each of the plurality of first enabling modules generates the first enable signal when the voltage of the first voltage input is less than the first reference voltage.

One aspect of the present disclosure provides a dynamic random access memory (DRAM). In some embodiments, the DRAM includes a memory array, a plurality of word lines and a charge pump system, and the plurality of word lines are disposed in the memory array. In some embodiments, the charge pump system is coupled to the plurality of word lines and is configured to generate an overall pump current for the plurality of word lines. In some embodiments, the charge pump system includes a pump circuit including a plurality of pumping modules and a plurality of first enabling modules. In some embodiments, each of the plurality of pumping modules is configured to generate a pump current. In some embodiments, the plurality of first enabling modules are respectively coupled to a portion of the plurality of pumping modules. In some embodiments, each of the plurality of first enabling modules is configured to generate a first enable signal. In some embodiments, each of the plurality of first enabling modules includes a first voltage input, a first comparing unit, a first digital logic gate and a second digital logic gate. In some embodiments, the first comparing unit is coupled to the first voltage input and is configured to compare a voltage of the first voltage input with a first reference voltage. In some embodiments, the first digital logic gate is coupled to the first comparing unit and is configured to implement a logical operation. In some embodiments, the second digital logic gate is coupled to the first digital logic gate and is configured to implement a logical negation. In some embodiments, each of the plurality of first enabling modules generates the first enable signal when the voltage of the first voltage input is less than the first reference voltage.

One aspect of the present disclosure provides a method for controlling an overall pump current. In some embodiments, the method includes the following steps. A voltage of a voltage input is compared with a reference voltage. An inverted signal is generated. A logical operation is implemented based on a comparison between the voltage of the voltage input, the reference voltage and the inverted signal. A first enable signal is generated based on a result of the logical operation.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A pump circuit, comprising:
  a plurality of pumping modules, wherein each of the plurality of pumping modules is configured to generate a pump current; and
  a plurality of first enabling modules respectively coupled to a portion of the plurality of pumping modules, wherein each of the plurality of first enabling modules is configured to generate a first enable signal;

wherein each of the plurality of first enabling modules includes:
- a first voltage input,
- a first comparing unit coupled to the first voltage input and configured to compare a voltage of the first voltage input with a first reference voltage,
- a first digital logic gate coupled to the first comparing unit and configured to implement a logical operation, and
- a second digital logic gate coupled to the first digital logic gate and configured to implement a logical negation; and wherein each of the plurality of first enabling modules generates the first enable signal when the voltage of the first voltage input is less than the first reference voltage.

2. The pump circuit of claim 1, further comprising a first voltage-dividing module coupled to the plurality of first enabling modules and configured to convert a power supply voltage to the voltage of the first voltage input for each of the plurality of first enabling modules.

3. The pump circuit of claim 2, wherein:
- the first voltage-dividing module includes a plurality of first dividing resistors; and
- the first voltage input of each of the plurality of first enabling modules is coupled to a node that is between a corresponding pair of the plurality of first dividing resistors.

4. The pump circuit of claim 1, further comprising a plurality of second enabling modules respectively coupled to the remaining of the plurality of pumping modules, wherein:
- each of the plurality of second enabling modules is configured to generate a second enable signal, and includes a second voltage input and a second comparing unit;
- the second comparing unit is coupled to the second voltage input and is configured to compare a voltage of the second voltage input with a second reference voltage; and
- each of the plurality of second enabling modules generates the second enable signal when the voltage of the second voltage input is less than the second reference voltage.

5. The pump circuit of claim 4, further comprising a second voltage-dividing module coupled to the plurality of second enabling modules and configured to convert a word line voltage to the voltage of the second voltage input for each of the plurality of second enabling modules.

6. The pump circuit of claim 5, wherein:
- the second voltage-dividing module includes a plurality of second dividing resistors; and
- the second voltage input of each of the plurality of second enabling modules is coupled to a node that is between a corresponding pair of the plurality of second dividing resistors.

7. A dynamic random access memory (DRAM), comprising:
- a memory array;
- a plurality of word lines disposed in the memory array; and
- a charge pump system coupled to the plurality of word lines and configured to generate an overall pump current for the plurality of word lines;
- wherein the charge pump system includes a pump circuit including:
  - a plurality of pumping modules, each configured to generate a pump current, and
  - a plurality of first enabling modules respectively coupled to a portion of the plurality of pumping modules, wherein each of the plurality of first enabling modules is configured to generate a first enable signal;

wherein each of the plurality of first enabling modules includes:
- a first voltage input,
- a first comparing unit coupled to the first voltage input and configured to compare a voltage of the first voltage input with a first reference voltage,
- a first digital logic gate coupled to the first comparing unit and configured to implement a logical operation, and
- a second digital logic gate coupled to the first digital logic gate and configured to implement a logical negation; and wherein each of the plurality of first enabling modules generates the first enable signal when the voltage of the first voltage input is less than the first reference voltage.

8. The DRAM of claim 7, wherein the pump circuit further includes a first voltage-dividing module coupled to the plurality of first enabling modules and configured to convert a power supply voltage to the voltage of the first voltage input for each of the plurality of first enabling modules.

9. The DRAM of claim 8, wherein:
- the first voltage-dividing module includes a plurality of first dividing resistors; and
- the first voltage input of each of the plurality of first enabling modules is coupled to a node that is between a corresponding pair of the plurality of first dividing resistors.

10. The DRAM of claim 7, wherein:
- the pump circuit further includes a plurality of second enabling modules respectively coupled to the remaining of the plurality of pumping modules;
- each of the plurality of second enabling modules is configured to generate a second enable signal, and includes a second voltage input and a second comparing unit;
- the second comparing unit is coupled to the second voltage input and is configured to compare a voltage of the second voltage input with a second reference voltage; and
- each of the plurality of second enabling modules generates the second enable signal when the voltage of the second voltage input is less than the second reference voltage.

11. The DRAM of claim 10, wherein the pump circuit further includes a second voltage-dividing module coupled to the plurality of second enabling modules and configured to convert a word line voltage to the voltage of the second voltage input for each of the plurality of second enabling modules.

12. The DRAM of claim 11, wherein:
- the second voltage-dividing module includes a plurality of second dividing resistors; and
- the second voltage input of each of the plurality of second enabling modules is coupled to a node that is between a corresponding pair of the plurality of second dividing resistors.

13. The DRAM of claim 7, wherein the charge pump system further includes an oscillator coupled to the pump circuit and configured to generate a clock signal for the pump circuit.

14. The DRAM of claim 13, wherein the pump circuit generates the overall pump current based on an oscillating frequency of the oscillator.

15. The DRAM of claim 14, wherein the oscillating frequency of the oscillator is fixed.

16. The DRAM of claim 14, wherein the oscillating frequency of the oscillator is variable.

17. A method of controlling an overall pump current, comprising:
- comparing a voltage of a voltage input with a reference voltage;
- generating an inverted signal;
- implementing a logical operation based on a comparison between the voltage of the voltage input, the reference voltage and the inverted signal; and
- generating a first enable signal based on a result of the logical operation.

18. The method of claim 17, further comprising converting a power supply voltage to the voltage of the voltage input.

19. The method of claim 17, wherein the first enable signal is generated when the voltage of the voltage input is less than the reference voltage.

20. The method of claim 17, wherein the inverted signal is generated from a second enable signal.

* * * * *